United States Patent
Escamilla et al.

(10) Patent No.: US 11,558,974 B2
(45) Date of Patent: Jan. 17, 2023

(54) INTEGRATED SAFETY LATCH FOR COLD SWAP ONLY DEVICES

(71) Applicant: DELL PRODUCTS, LP, Round Rock, TX (US)

(72) Inventors: Eduardo Escamilla, Round Rock, TX (US); Amrita Sidhu Maguire, Cedar Park, TX (US); Corey D. Hartman, Hutto, TX (US)

(73) Assignee: Dell Products L.P., Round Rock, TX (US)

( * ) Notice: Subject to any disclaimer, the term of this patent is extended or adjusted under 35 U.S.C. 154(b) by 45 days.

(21) Appl. No.: 17/340,569

(22) Filed: Jun. 7, 2021

(65) Prior Publication Data

US 2022/0394871 A1    Dec. 8, 2022

(51) Int. Cl.
*H05K 7/14*        (2006.01)
*H05K 5/02*        (2006.01)

(52) U.S. Cl.
CPC ......... *H05K 7/1408* (2013.01); *H05K 5/0221* (2013.01)

(58) Field of Classification Search
CPC .................................................. H05K 7/1409
See application file for complete search history.

(56) References Cited

U.S. PATENT DOCUMENTS

| 10,070,549 | B2 * | 9/2018 | Su ........................ H05K 7/1409 |
| 10,146,273 | B1 | 12/2018 | Noorbakhsh et al. |
| 11,003,613 | B2 | 5/2021 | Escamilla et al. |
| 2015/0146372 | A1 * | 5/2015 | French, Jr. ........... H05K 7/1489 29/854 |

* cited by examiner

*Primary Examiner* — Jerry Wu
(74) *Attorney, Agent, or Firm* — Larson Newman, LLP

(57) ABSTRACT

A drive carrier for a cold plug device of an information handling system includes a handle, a first latch, and a second latch. The handle rotates between a locked position and an unlocked position. The first latch includes first and second ends, and slides between first and second positions. The handle is held in the locked position when the first latch is in the first position. The second latch includes first and second ends. The first end of the second latch is pivotally attached to the second end of the first latch and the second end of the second latch snap fits over a first end of the handle. The second latch prevents the first latch from sliding from the first position to the second position when the second end of the second latch is snap fitted over the first end of the handle.

16 Claims, 8 Drawing Sheets

INTEGRATED SAFETY LATCH FOR COLD SWAP ONLY DEVICES

FIELD OF THE DISCLOSURE

The present disclosure generally relates to information handling systems, and more particularly relates to an integrated safety latch for cold swap only devices.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A drive carrier for a cold plug device of an information handling system includes a front portion to be placed in physical communication with a front portion of the device. The front portion includes a handle, a first latch, and a second latch. The handle may rotate between a locked position and an unlocked position. The first latch includes first and second ends, and the first latch may slide between a first position and a second position. The handle may be held in the locked position when the first latch is in the first position. The second latch includes first and second ends. The first end of the second latch is pivotally attached to the second end of the first latch, and the second end of the second latch may snap fit over a first end of the handle. The second latch may prevent the first latch from sliding from the first position to the second position when the second end of the second latch is snap fitted over the first end of the handle.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
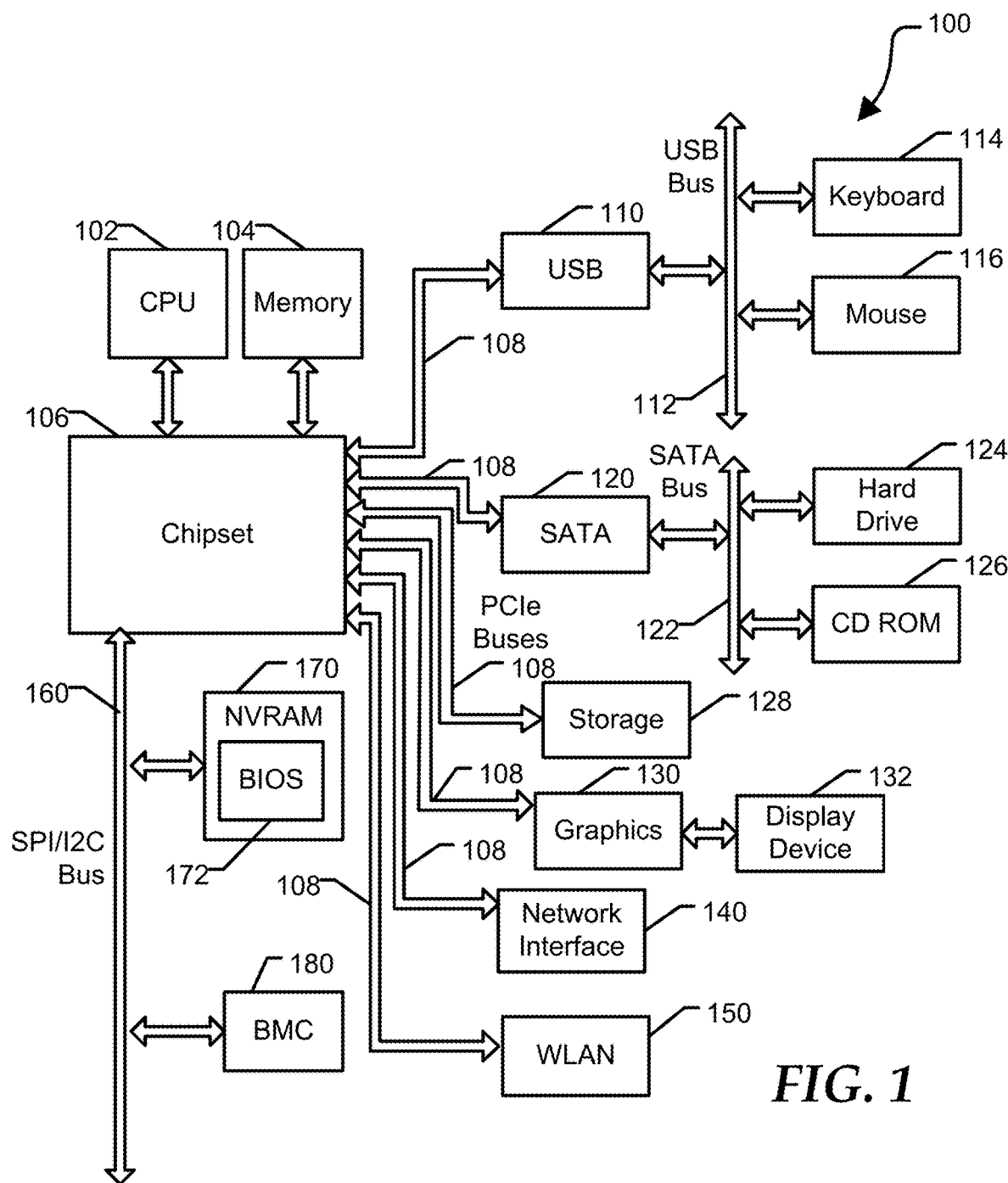
FIG. 1 is a block diagram of a general information handling system according to at least one embodiment of the present disclosure.

FIG. 1 illustrates a general information handling system 100. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more busses operable to transmit communications between the various hardware components.

Information handling system 100 including a processor 102, a memory 104, a chipset 106, one or more PCIe buses 108, a universal serial bus (USB) controller 110, a USB bus 112, a keyboard device controller 114, a mouse device controller 116, a configuration a SATA bus controller 120, a SATA bus 122, a hard drive device controller 124, a compact disk read only memory (CD ROM) device controller 126, a storage 128, a graphics device controller 130, a network interface controller (NIC) 140, a wireless local area network (WLAN) or wireless wide area network (WWAN) controller 150, a serial peripheral interface (SPI) bus 160, a NVRAM 170 for storing BIOS 172, and a baseboard management controller (BMC) 180. In an example, chipset 106 may be directly connected to an individual end point via a PCIe root port within the chipset and a point-to-point topology as shown in FIG. 1. BMC 180 can be referred to as a service processor or embedded controller (EC). Capabilities and functions provided by BMC 180 can vary considerably based on the type of information handling system. For example, the term baseboard management system is often used to describe an embedded processor included at a server, while an embedded controller is more likely to be found in a consumer-level device. As disclosed herein, BMC 180 represents a processing device different from CPU 102, which provides various management functions for information handling system 100. For example, an embedded controller may be responsible for power management, cooling management, and the like. An embedded controller included at a data storage system can be referred to as a storage enclosure processor.

System 100 can include additional processors that are configured to provide localized or specific control functions, such as a battery management controller. Bus 160 can include one or more busses, including a SPI bus, an I2C bus, a system management bus (SMBUS), a power management bus (PMBUS), and the like. BMC 180 can be configured to provide out-of-band access to devices at information handling system 100. As used herein, out-of-band access herein refers to operations performed prior to execution of BIOS 172 by processor 102 to initialize operation of system 100.

BIOS 172 can be referred to as a firmware image, and the term BIOS is herein used interchangeably with the term firmware image, or simply firmware. BIOS 172 includes instructions executable by CPU 102 to initialize and test the hardware components of system 100, and to load a boot loader or an operating system (OS) from a mass storage device. BIOS 172 additionally provides an abstraction layer for the hardware, such as a consistent way for application programs and operating systems to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device.

Information handling system 100 can include additional components and additional busses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and redundant bus controllers. One or more components can be integrated together. For example, portions of chipset 106 can be integrated within CPU 102. Additional components of information handling system 100 can include one or more storage devices that can store machine-executable code, one or more communications ports for communicating with external devices, and various input and output (I/O) devices, such as a keyboard, a mouse, and a video display. An example of information handling system 100 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Figure 2:
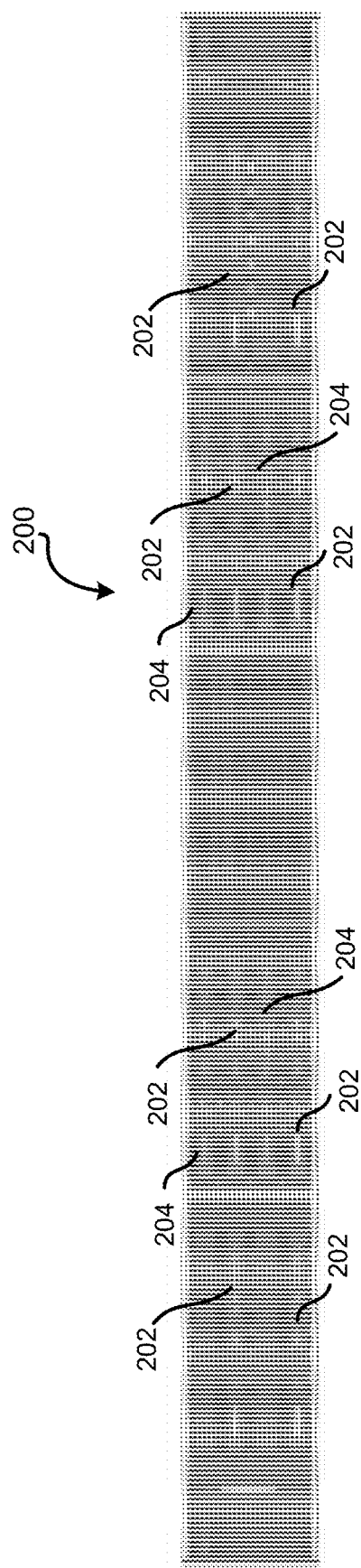
FIG. 2 is a diagram of an information handling system including multiple cold and hot plug devices according to at least one embodiment of the disclosure.

In an example, information handling system 100 may be any suitable device including, but not limited to, devices 202 and 204 of FIG. 2. Information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

FIG. 2 illustrates an information handling system or server 200 to receive multiple cold plug devices 202 and hot plug devices 204 according to at least one embodiment of the disclosure. Server 200 includes multiple bays 210, 212, 214, and 216 to receive cold plug devices 202 and hot plug devices 204. Each bay 201-216 may individually receive devices of a single type of media, such as only cold plug devices 202 or only hot plug devices 204, or may receive devices of different types of media, such as both cold plug devices 202 and hot plug devices 204. In an example, server 200 may be configured utilize any suitable types of media devices 202 and 204. For example, devices 202 and 204 may include, but is not limited to, non-volatile memory express (NVMe), dynamic random access memory (DRAM) expansion, storage class memory, and network interface cards. In an example, server 200 may include a backplane with a common connector to interface with devices of different technologies.

Based on the common connector of the backplane, server 200 may include a mix of device types, such as cold plug devices 202 and hot plug devices 204. In an example, hot plug devices 204 may be inserted or removed from the backplane of server 200 while the server is powered on or off. However, cold plug devices 202 only may be safely inserted or removed from the backplane of server 200 when the server is powered off. In certain examples, an information handling system, such as server 200, may be commonly populated with hot plug devices 204, such as hot plug NVMe devices. In these situations, an individual associated with server 200 may frequently remove hot plug devices 204, such that the individual may be mistakenly remove a cold plug device 202 without first powering down the server. If a user removes a cold plug device 202 without shutting down server 200, the removal of the cold plug device may result in data loss, unplanned system downtime/failure, or other unsatisfactory results. An information handling system, such as server 200 or device 202, may be improved by drive carrier 304 of FIG. 3.

Figure 3:
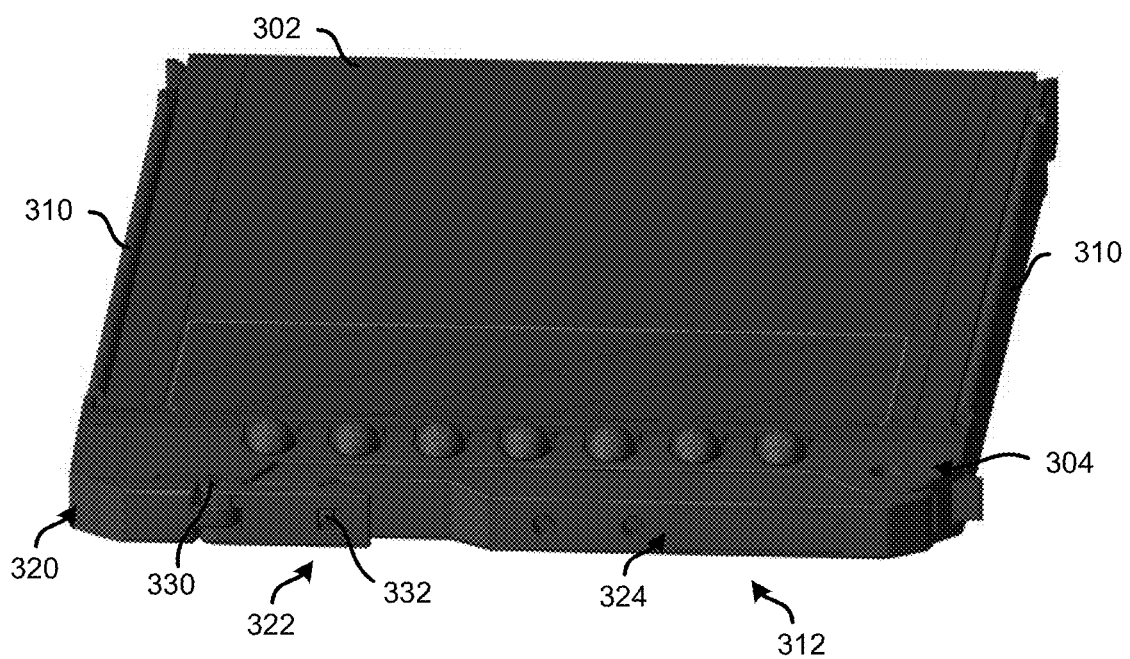
FIG. 3 is a diagram of a device and a device carrier according to at least one embodiment of the disclosure.

FIG. 3 illustrates a device 302 and a device carrier 304 according to at least one embodiment of the disclosure. Device carrier 304 includes side portions 310 and a front portion 312. Front portion 312 includes a primary latch 320, a secondary latch 322, and a handle 324. Handle 324 may be any suitable device such as a cam lever, which may be utilized during removal of device 302 from an information handling system, such as server 200 of FIG. 2. In an example, device 302 may be in physical communication with device carrier in any suitable manner. For example, each side of device 302 may be in physical communication with a respective side portion 410 of device carrier 304, and a front of the device may be in physical communication with front portion 312 of drive carrier 304. Device 302 and device carrier 304 may be collectively referred to as a device, such as cold plug device 202 of FIG. 2. One of ordinary skill would recognize that side and front are descriptive based on FIG. 3. However, any descriptive word or words may be utilized to describe an orientation of the portions of device carrier 304 without varying from the scope of this disclosure.

In an example, handle 324 may be utilized to remove device 302 and device carrier 304 from an information handling system, such as server 200 of FIG. 2. Handle 324 may transition between a locked position and a locked position. When handle 324 is in the locked position, the handle may hold device 302 within an information handling system, such as server 200 of FIG. 2. When handle 324 is in the unlocked position, an individual may exert a force on the handle to remove device 302 within an information handling system.

In an example, based on any suitable force being exerted on primary latch 320, the latch may transition between first and second positions. In an example, primary latch 320 includes a spring, which in turn biases the primary latch toward the second position. When primary latch 320 is in the second position, the primary latch may hold handle 324 in the locked position as shown in FIG. 3. Secondary latch 322 may connect to primary latch 320 at a connection point 330, and snap fit over a hook 332 of handle 324. In an example, secondary latch 322 may prevent an individual inadvertently moving or transiting the primary latch from the first position to the second position. In this example, secondary latch 322 may cause the individual to perform deliberate and additional steps for device removal so that a cold plug device, such as device 302, is not inadvertently removed.

Secondary latch 322 may provide a physical barrier to primary latch 320 to prevent an individual from prematurely releasing device 302. Based on secondary latch 322 being a physical barrier to the removal of device 302, an individual may remember to perform critical caching of data, powering down an information handling system, such as server 200 of FIG. 2, or the like before removing the device. In an example, secondary latch 322 may include any suitable component including, but not limited to, a label with a notification to power down an information handling system, such as server 200 of FIG. 2, prior to the removal of device 302. In certain examples, secondary latch 322 may be integrated into primary latch 320 through connection point 330.

Figure 4:
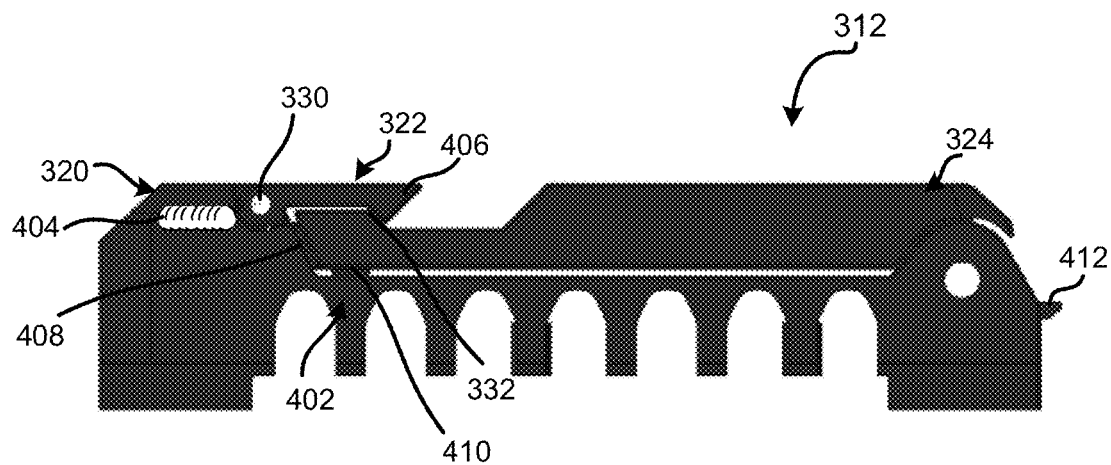
FIGS. 4-6 are diagrams of the device carrier in different positions during a transition from a locked position to an unlocked according to at least one embodiment of the disclosure.
Figure 5:
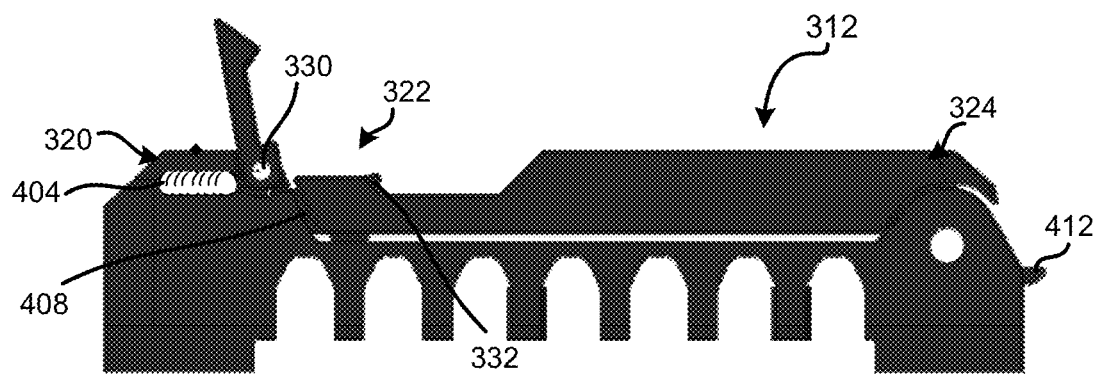
Figure 6:
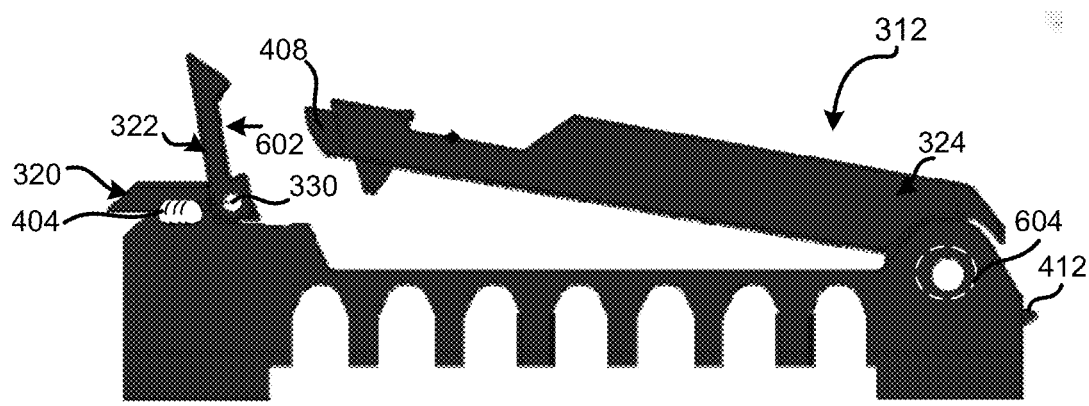

FIGS. 4-6 illustrate front portion 312 of a device carrier in different positions during a transition from a locked position to an unlocked according to at least one embodiment of the disclosure. Front portion 312 includes an insert portion 402, primary latch 320, secondary latch 322, and handle 324. Primary latch 320 includes a spring 404 to bias the primary latch towards a first position. Secondary latch 322 includes a snap fit portion 406. Handle 324 includes a snap fit portion 408, a tab 410, a lock component 412, and hook 332.

Referring now to FIG. 4, front portion 312 of the device carrier is shown in a fully locked position. In the fully locked position, handle 324 is in a locked position, such that tab 410 is inserted within insert portion 402 and snap fit portion 408 is located within front portion 312 and below primary latch 320. In an example, while primary latch 320 is in the first position, as shown in FIG. 4, the primary latch may hold handle 324 in the locked position. When handle 324 is in the locked position, lock component 412 may be placed in physical communication with an information handling system, such as server 200, and the lock component may hold a device within the server.

In certain examples, secondary latch 324 may be utilized as a secure or safety latch to prevent an inadvertent removal of a device connected to the device carrier. In an example, secondary latch 322 is connected to primary latch 320 at connection or pivot point 330, and may rotate around the pivot point. Secondary latch 322 may hold front portion 312 in the fully locked position in any suitable manner. For example, snap fit portion 406 of secondary latch 322 may snap fit over hook 332 of handle 324. In this example, the snap fit between the secondary latch 322 and handle 324 may prevent primary latch 320 from transitioning from the first position to a second position.

Referring now to FIG. 5, secondary latch 322 may be released in any suitable manner. For example, a force may be applied to move secondary latch 322 up and away from handle 324 in the direction of arrow 502. Based on the force in direction of arrow 502, secondary latch 322 may rotate around connection point 330 until the secondary latch is substantially perpendicular to first latch 320. When secondary latch 322 is released but primary latch 320 is still in the first position, as shown in FIG. 5, front portion 312 of the device carrier may be in an intermediate position. When front portion 312 is in the intermediate position, primary latch 320 may still hold handle 324 in the locked position, such that lock component 412 is in physical communication with an information handling system, such as server 200, and may hold a device within the server.

Referring now to FIG. 6, front portion 312 is in an unlocked position. In an example, a force may be exerted against secondary latch 322 in the direction of arrow 602. Secondary latch 322 may include an ergonomic surface area to be a comfortable touchpoint for an individual. In certain examples, the force exerted, in the direction of arrow 602, on secondary latch 322 may be transferred to primary latch 320 via connection point 330. In response to the force on primary latch 320 exceeding a force of spring 404, the spring may be compressed and the primary latch may transition from the first position to a second position. When primary latch 320 is in the second position, handle 324 may transition from the locked position to an unlocked position.

In an example, a spring 604 may exert a force on handle 324 to move the handle to the unlocked position. When handle 324 is in the unlocked position, lock component 412 may no longer be in physical communication with the information handling system or server 200 of FIG. 2. Based on lock component 412 not being in physical communication with the server, an individual may be able to remove a device from an information handling system or server 200 of FIG. 2. In an example, the individual may pull on handle 324 to remove the device.

Figure 7:
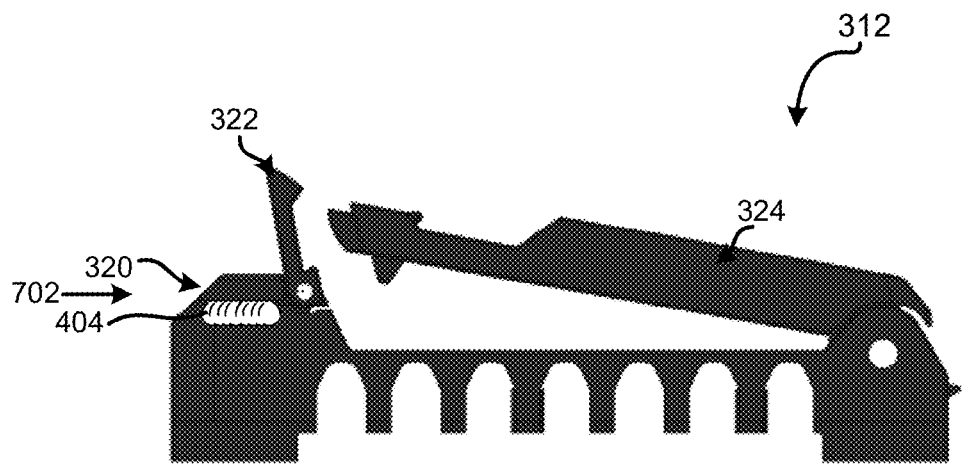
FIGS. 7-9 are diagrams of the device carrier in different positions during a transition from the unlocked position to the locked position according to at least one embodiment of the disclosure.
Figure 8:
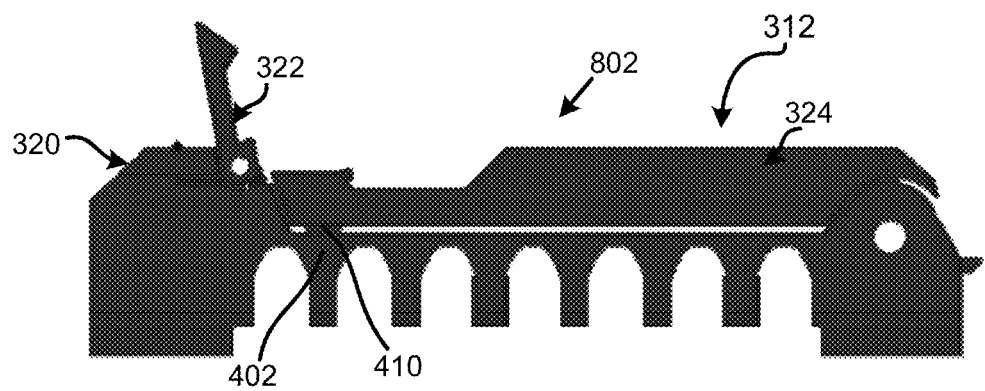
Figure 9:
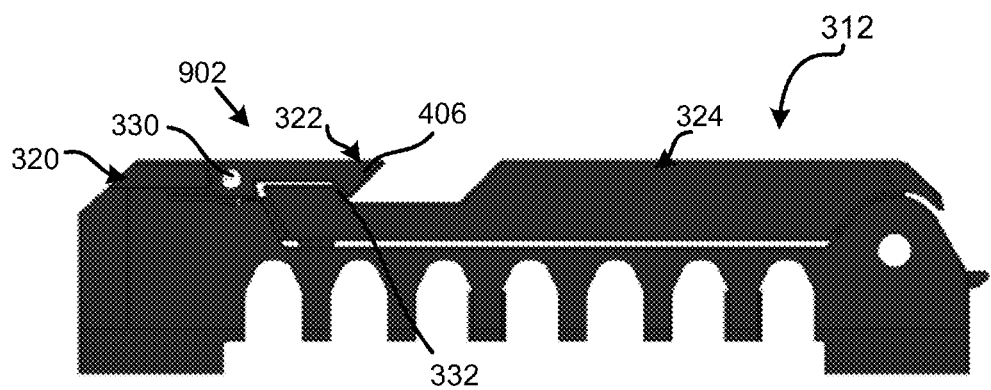

FIGS. 7-9 illustrate front portion 312 different positions during a transition from the unlocked position to the locked position according to at least one embodiment of the disclosure. Referring now to FIG. 7, when a force is no longer exerted against secondary latch 322, spring 404 may exert a force, in the direction of arrow 702, on primary latch 320 and cause primary latch to transition from the second position to the first position. In this situation, front portion 312 may be in the unlock position.

Referring to FIG. 8, a force may be exerted, in the direction of arrow 802, on handle 324 to push extension portion 408 past primary latch 320. When extension portion 408 is below primary latch 320, front portion 312 is in the locked position. In an example, tab 410 may be inserted within insert portion 402 while front portion 312 is in the locked position.

Referring now to FIG. 9, front portion 312 may be placed in a fully locked position in any suitable manner. For example, a force may be exerted, in the direction of arrow 902, on secondary latch 322 to push the secondary latch down onto handle 324. As secondary latch 322 is pushed onto handle 324, snap fit portion 406 of the second latch may snap fit around hook 332 of the handle to secure front portion 312 of the device carrier in the fully locked position.

Figure 10:
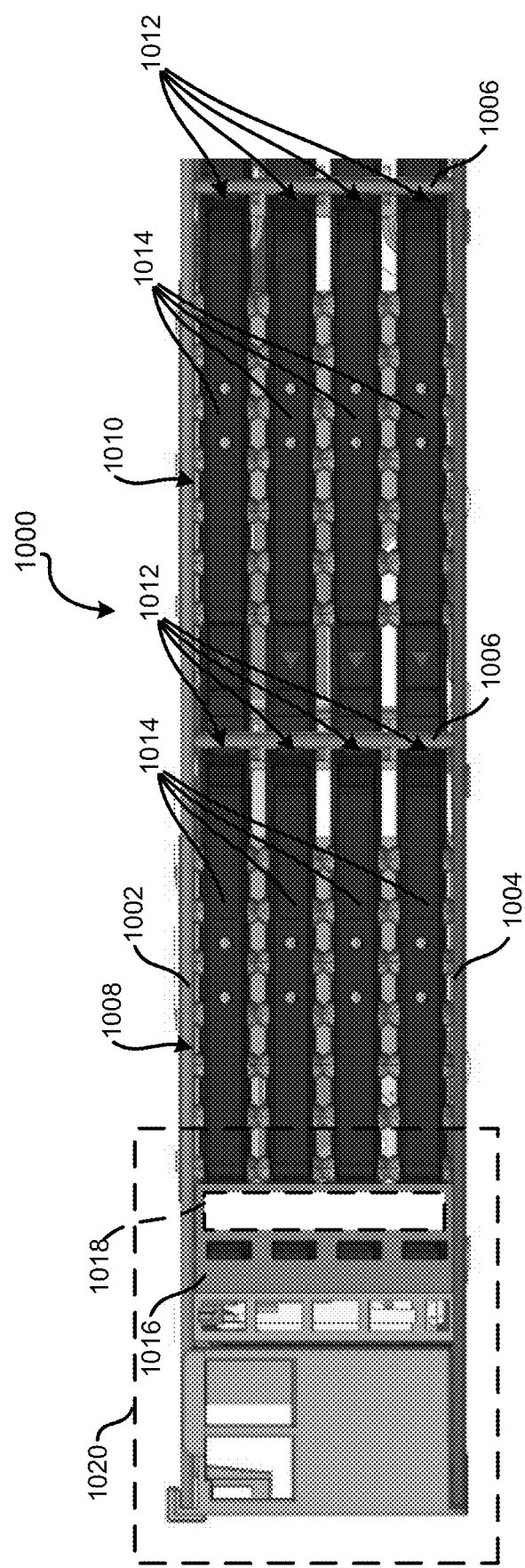
FIG. 10 is diagram of an information handling system with a bay latch over a bay of the information handling system according to at least one embodiment of the current disclosure.

FIG. 10 illustrates an information handling system or server 1000 including a top surface 1002, a bottom surface 1004, and multiple bay walls 1006 according to at least one embodiment of the current disclosure. Top surface 1002, bottom surface 1004, and bay walls 1006 may join together to form one or more bays, such as bays 1008 and 1010. Bays 1008 and 1010 include multiple device slots 1012, which in turn may each hold a different one of devices 1014. In certain examples, devices 1014 may be any suitable type of device, such as a cold plug device, a hot plug device, or the like. Server 1000 includes a bay latch 1016, which in turn includes a notification label 1018.

In an example, each slot in a bay, such as each device slot 1012 of bay 1008, may include cold plug devices 1014. In this situation, devices 1014 inserted within devices slots 1012 of bay 1008 may be safely removed only if server 1000 is powered down before the device is removed. In an example, bay latch 1016 may cover multiple devices 1014 within bay 1008, and prevent premature removal of the devices from the bay. As stated above, premature removal of cold plug devices 1014 may result in data loss, unplanned system downtime/failure, or other unsatisfactory results. In an example, bay latch 1016 may cause an individual associated with server 1000 to perform at least one additional step before a cold plug device 1014 may be removed.

For example, bay latch 1016 may cover a primary latch of cold plug device 1014 to prevent the primary latch from being unlocked while the bay latch is in a closed position and the individual must move the bay latch before unlocking the primary latch of the cold plug device. In an example, notification label 1018 on bay latch 1016 may include any suitable message to inform the individual to power server 1000 down before removing cold plug device 1014. Bay latch 1016 may transition from a closed position to an open position as will be described with respect to FIGS. 11 and 12 below.

Figure 11:
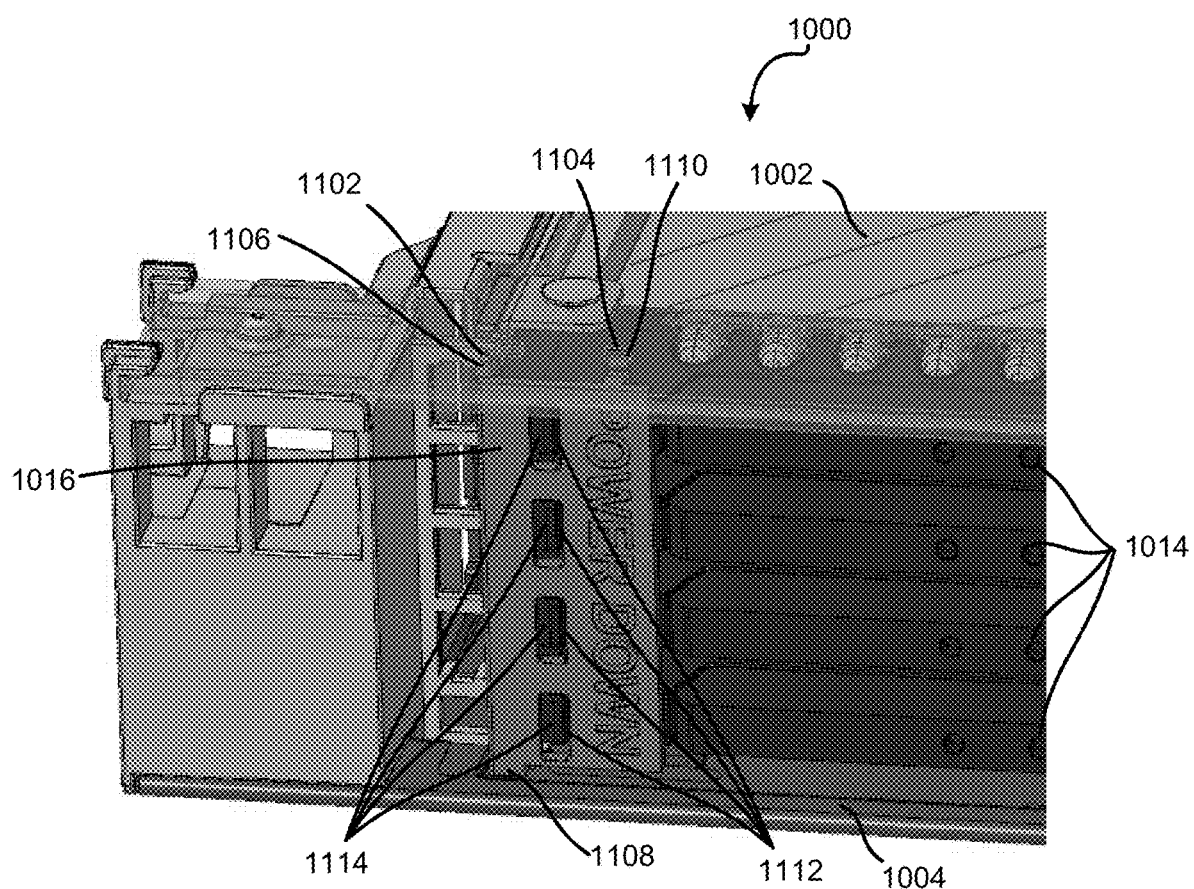
FIG. 11 is diagram of an enlarged view of a portion of the information handling system with a bay latch in a locked position according to at least one embodiment of the current disclosure.
Figure 12:
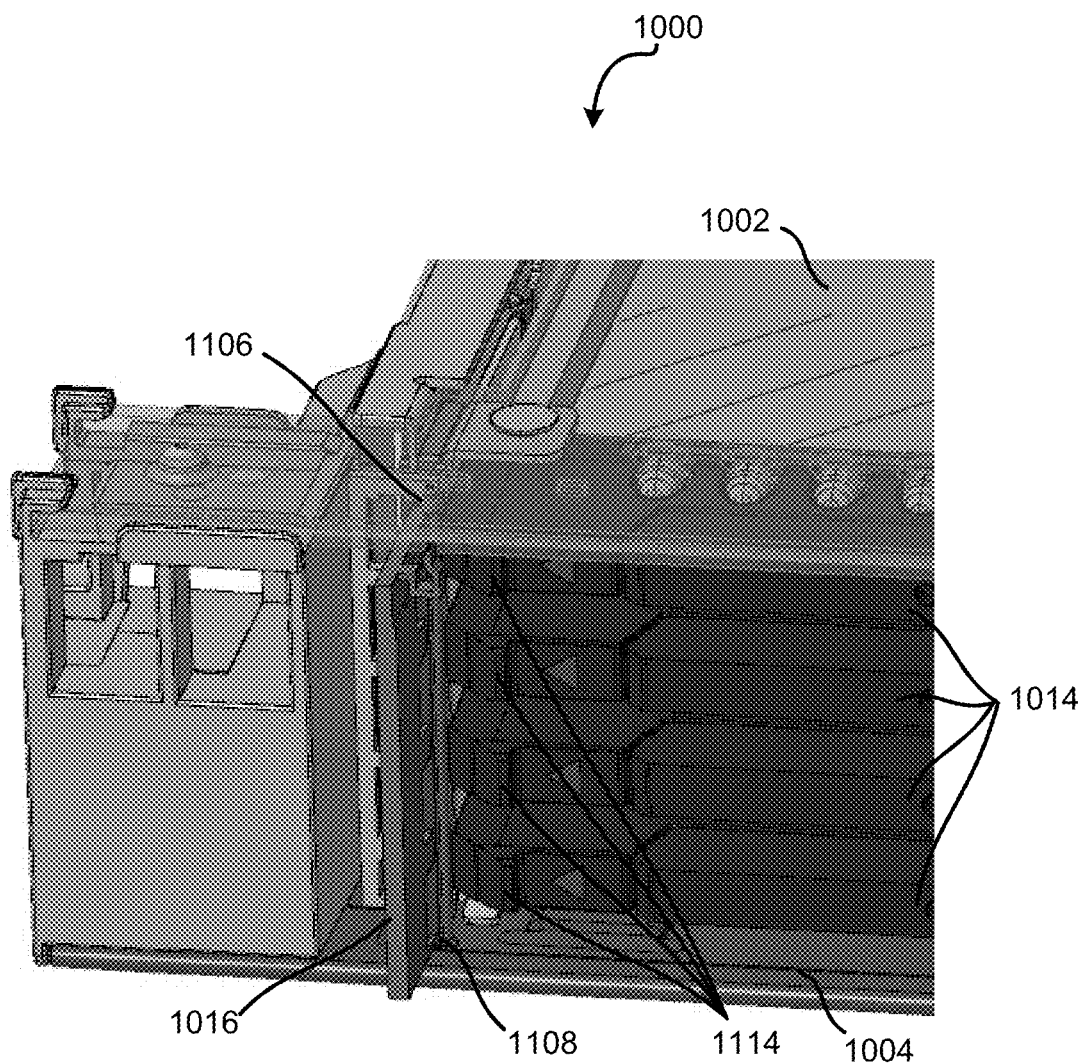
FIG. 12 is diagram of the enlarged view of the portion of the information handling system with the bay latch in an unlocked position according to at least one embodiment of the current disclosure.

FIGS. 11 and 12 illustrate an enlarged view of a portion of server 1000 identified by box 1020 in FIG. 10, according to at least one embodiment of the current disclosure. Top surface 1002 includes multiple indications or holes 1102 and 1104. Bay latch 1016 includes pins 1106 and 1108, a tab 1110, and securing inserts 1112. In an example, pins 1106 and 1108 may be utilized to hold bay latch 1016 in between top surface 1002 and bottom surface 1004. For example, pin 1104 may be inserted within hole 1102 of top surface 1002 and pin 1108 may be inserted within a corresponding hole of bottom surface 1004.

Referring now to FIG. 11, pins 1106 and 1108, tab 1110, and securing inserts 1112 may be utilized in any suitable manner to hold bay latch 1016 in a closed position and to guide transitions of the bay latch between a closed position and an open position. For example, securing inserts 1112 of bay latch 1016 may snap fit on hooks 1114 of cold plug devices 1014. In response to each securing inserts 1112 snap fitting on a corresponding hook 1114, bay latch 1015 may be secured in the closed position. Bay latch 1016 may also be secured in the closed position by tab 1110 snap fitting within hole 1104. In an example, tab 1110 may be any suitable material that may bend and snap back to an original shape within hole 1104, such as a rubber material.

In an example, a force may be exerted on bay latch 1016 in a direction away from devices 1014. When the force is greater than a force of the snap fit between each securing latch 1112 and a corresponding hook 1114 and the force of tab 1110 snap fitted within hole 1004, bay latch 1016 may transition from the closed position to the open position. In an example, a force may be exerted on bay latch 1016 in a direction of devices 1014 to cause the bay latch to transition from the open position to the closed position. In certain examples, bay latch 1016 may rotate around pins 1106 and 1108 during a transition from the closed position to the open position, and during a transition from the open position to the closed position.

Referring now to FIG. 12, bay latch 1016 is located in the open position, such that the bay latch is substantially perpendicular to cold plug devices 1014. In an example, while bay latch 1016 is in the open position, an individual may be able to release one or more cold plug devices 1014 slide the cold plug devices from server 1000. In an example, pin 1106 may snap fit into and out of hole 1102 of top surface 1002 and pin 1108 may snap fit into and out of a corresponding hole in bottom surface 1004. In this example, bay latch 1016 may be inserted or removed from server 1000 as a tooless component based on whether cold plug devices 1014 are located within same bay of the server. As described above, bay latch 1016 may cause an individual associated with server 1000 to perform additional steps before removing cold plug devices 1014. In this manner, bay latch 11016 may prevent cold plug devices 1014 from being improperly removed from server 1000.

Referring back to FIG. 1, the information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A drive carrier for a device of an information handling system, the drive carrier comprising: a front portion to be placed in physical communication with a front portion of the device, wherein the device is a cold plug device to be inserted within a server, the front portion of the drive carrier including: a handle rotatable between a locked position and an unlocked position on a first side of the front portion of the drive carrier; a first latch including first and second ends, the first latch to slide between a first position and a second position on a second side of the front portion of the drive carrier opposite to the first side, wherein the handle is held in the locked position when the first latch is in the first position; and a second latch including first and second ends, the first end of the second latch pivotally attached to the second end of the first latch, and the second end of the second latch to snap fit over a first end of the handle, wherein the second latch prevents the first latch from sliding from the first position to the second position when the second end of the second latch is snap fitted over the first end of the handle.

2. The drive carrier of claim 1, further comprising:
first and second side portions, the first side portion to be placed in physical communication with a first side portion of the device and the second side portion to be placed in physical communication with a second side portion of the device.

3. The drive carrier of claim 1, wherein the driver carrier and the device are secured within a slot of the server when the handle is in the locked position.

4. The drive carrier of claim 1, wherein the second latch is in a locked position when the second end of the second latch is snap fitted over the first end of the handle, and is an unlocked position is substantially perpendicular to the first latch.

5. The drive carrier of claim 4, wherein the first latch further includes a spring to bias the first latch towards the first position.

6. The drive carrier of claim 5, wherein a first force exerted on the second latch is transferred to the first latch via a connection point between the first and second latches.

7. The drive carrier of claim 6, wherein the first latch transitions from the first position to the second position in response to the first forced exerted being greater than a second force of the spring.

8. The drive carrier of claim 1, wherein the second end of the second latch includes an insert to receive a hook portion on the first end of the cam lever.

9. An information handling system comprising: a bay including a plurality of slots; a device to be inserted within one of the slots of the bay, wherein the device is a cold plug device to be inserted within the information handling system; and a device carrier to be in physical communication with the device, the device carrier including: a front portion to be placed in physical communication with a front portion of the device, the front portion of the drive carrier including: a handle to rotate between a locked position and an unlocked position on a first side of the front portion of the drive carrier; a first latch including first and second ends, the first latch to slide between a first position and a second position on a second side of the front portion of the drive carrier opposite to the first side, wherein the handle is held in the locked position when the first latch is in the first position; and a second latch including first and second ends, the first end of the second latch pivotally attached to the second end of the first latch, and the second end of the second latch to snap fit over a first end of the handle, wherein the second latch prevents the first latch from sliding from the first position to the second position when the second end of the second latch is snap fitted over the first end of the handle.

10. The information handling system of claim 9, further comprising:
first and second side portions, the first side portion to be placed in physical communication with a first side portion of the device and the second side portion to be placed in physical communication with a second side portion of the device.

11. The information handling system of claim 9, wherein the driver carrier and the device are secured within a slot of the server when the handle is in the locked position.

12. The information handling system of claim 9, wherein the second latch is in a locked position when the second end of the second latch is snap fitted over the first end of the handle, and is an unlocked position is substantially perpendicular to the first latch.

13. The information handling system of claim 12, wherein the first latch further includes a spring to bias the first latch towards the first position.

14. The information handling system of claim 13, wherein a first force exerted on the second latch is transferred to the first latch via a connection point between the first and second latches.

15. The information handling system of claim 14, wherein the first latch transitions from the first position to the second position in response to the first forced exerted being greater than a second force of the spring.

16. The information handling system of claim 9, wherein the second end of the second latch includes an insert to receive a hook portion on the first end of the cam lever.

* * * * *